United States Patent
Suwa et al.

(10) Patent No.: US 11,437,503 B2
(45) Date of Patent: Sep. 6, 2022

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Takeshi Suwa, Kawasaki Kanagawa (JP); Tomoko Matsudai, Tokyo (JP); Yoko Iwakaji, Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 67 days.

(21) Appl. No.: 17/020,471

(22) Filed: Sep. 14, 2020

(65) Prior Publication Data
US 2021/0296478 A1 Sep. 23, 2021

(30) Foreign Application Priority Data
Mar. 23, 2020 (JP) .............................. JP2020-050790

(51) Int. Cl.
*H01L 29/739* (2006.01)
(52) U.S. Cl.
CPC ................................ *H01L 29/7397* (2013.01)
(58) Field of Classification Search
None
See application file for complete search history.

(56) References Cited

U.S. PATENT DOCUMENTS

| 8,614,483 B2 | 12/2013 | Tanabe et al. |
| 9,515,067 B2 | 12/2016 | Saikaku et al. |
| 2014/0374871 A1* | 12/2014 | Hirabayashi ........ H01L 29/7397 257/488 |
| 2017/0250260 A1 | 8/2017 | Bina et al. |
| 2017/0250685 A1 | 8/2017 | Bina et al. |

(Continued)

FOREIGN PATENT DOCUMENTS

| JP | 5768395 B2 | 8/2015 |
| JP | 5831598 B2 | 12/2015 |

(Continued)

*Primary Examiner* — Hsien Ming Lee
(74) *Attorney, Agent, or Firm* — Kim & Stewart LLP

(57) ABSTRACT

A semiconductor device includes first and second electrodes, a semiconductor part therebetween, and first and second control electrodes in a trench of the semiconductor part. The first and second control electrodes are arranged along a front surface of the semiconductor part. The semiconductor part includes first and third layers of a first-conductivity-type, and the second and fourth layer of a second-conductivity-type. The second layer is provided between the first layer and the second electrode. Between the second layer and the second electrode, the third and fourth layers are provided apart from the first layer with first and second portions of the second layer interposed, respectively. The first portion of the second layer has a first thickness in a second direction from the first electrode toward the second electrode. The second portion of the second layer has a second thickness in the second direction larger than the first thickness.

15 Claims, 10 Drawing Sheets

(56) References Cited

U.S. PATENT DOCUMENTS

| | | |
|---|---|---|
| 2018/0277637 A1 | 9/2018 | Meiser et al. |
| 2018/0308757 A1 | 10/2018 | Kakimoto |
| 2019/0006495 A1 | 1/2019 | Tsuneo |
| 2020/0091325 A1 | 3/2020 | Matsudai et al. |

FOREIGN PATENT DOCUMENTS

| | | |
|---|---|---|
| JP | 2017-163136 A | 9/2017 |
| JP | 2018-164081 A | 10/2018 |
| JP | 2019-012813 A | 1/2019 |
| JP | 2019-016805 A | 1/2019 |
| JP | 2020-047756 A | 3/2020 |

\* cited by examiner

SEMICONDUCTOR DEVICE

CROSS-REFERENCE TO RELATED APPLICATIONS

This application is based upon and claims the benefit of priority from Japanese Patent Application No. 2020-050790, filed on Mar. 23, 2020; the entire contents of which are incorporated herein by reference.

FIELD

Embodiments relate to a semiconductor device.

BACKGROUND

It is desirable for a semiconductor device for power conversion to have high breakdown immunity.

DETAILED DESCRIPTION

Figure 1:
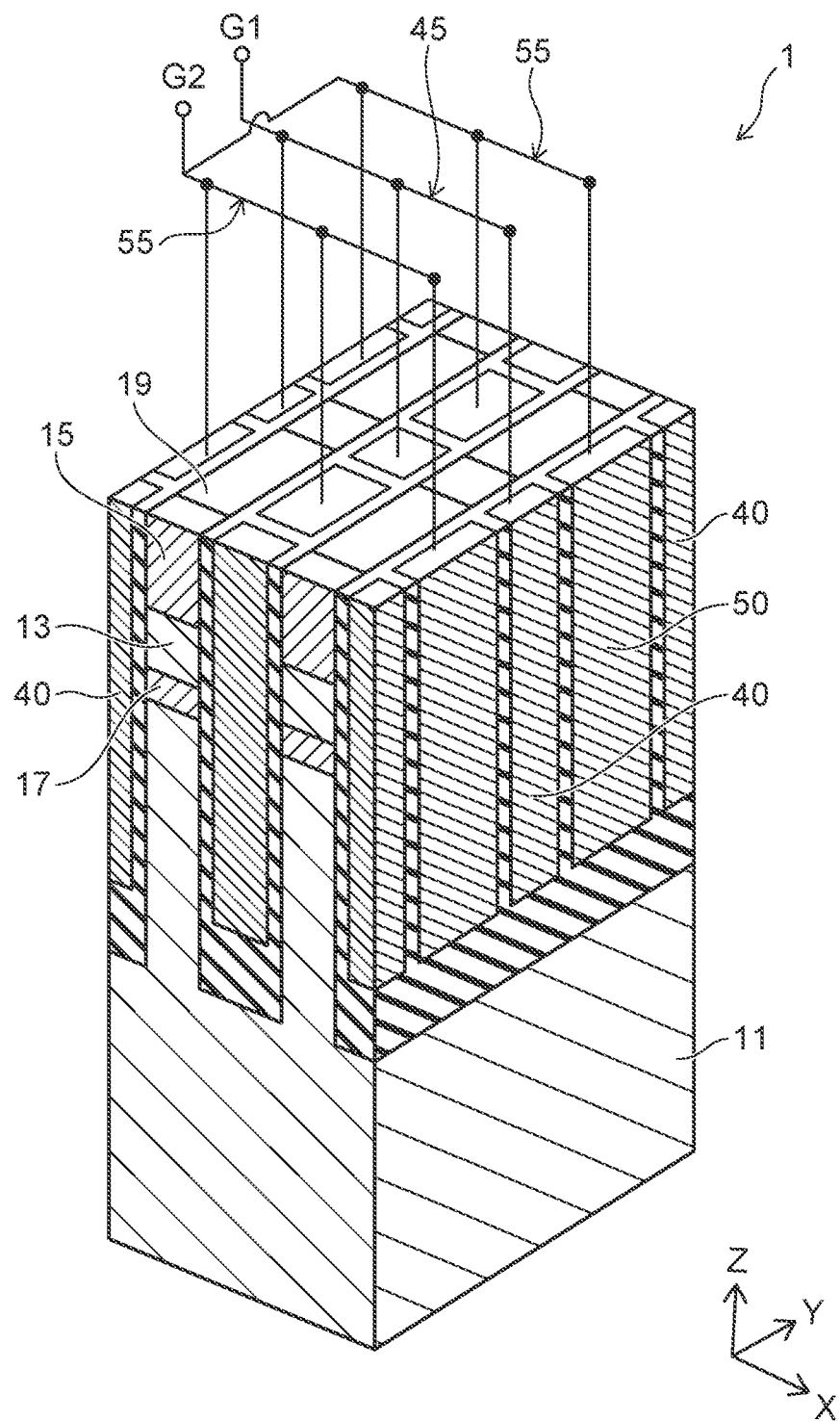
FIG. 1 is a perspective view schematically illustrating a semiconductor device according to a first embodiment.

According to one embodiment, a semiconductor device includes a semiconductor part having a trench at a front side; a first electrode provided on a back surface of the semiconductor part; a second electrode provided at the front side of the semiconductor part; a first control electrode provided inside the trench of the semiconductor part; and a second control electrode provided inside the trench of the semiconductor part with the first control electrode. The first control electrode is provided between the second electrode and the semiconductor part. The first control electrode is electrically insulated from the semiconductor part by a first insulating portion. The first and second control electrodes are arranged along an inner wall of the trench in the semiconductor part. The first and second control electrodes are arranged in a first direction along a front surface of the semiconductor part. The second control electrode is electrically insulated from the semiconductor part by a second insulating portion, and electrically insulated from the first control electrode by a third insulating portion. The semiconductor part includes a first layer of a first conductivity type, a second layer of a second conductivity type, a third layer of the first conductivity type, a fourth layer of the second conductivity type, and a fifth layer of the second conductivity type. The first layer extends between the first electrode and the second electrode. The trench extends into the first layer from the front surface of the semiconductor part. The second layer is provided between the first layer and the second electrode. The second layer faces the first control electrode via the first insulating portion. The second layer faces the second control electrode via the second insulating portion. The third layer is selectively provided between the second layer and the second electrode. The third layer is provided apart from the first layer with a first portion of the second layer interposed. The third layer contacts the first insulating portion, and is electrically connected to the second electrode. The fourth layer is selectively provided between the second layer and the second electrode. The fourth layer is provided apart from the first layer with a second portion of the second layer interposed. The fourth layer includes a second conductivity type impurity with a higher concentration than a concentration of a second conductivity type impurity in the second layer. The fourth layer is electrically connected to the second electrode. The fifth layer is provided between the first layer and the first electrode, and electrically connected to the first electrode. The first portion of the second layer has a first thickness in a second direction from the first electrode toward the second electrode. The second portion of the second layer has a second thickness in the second direction, the first thickness being less than the second thickness.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a perspective view schematically illustrating a semiconductor device 1 according to a first embodiment.

Figure 2A:
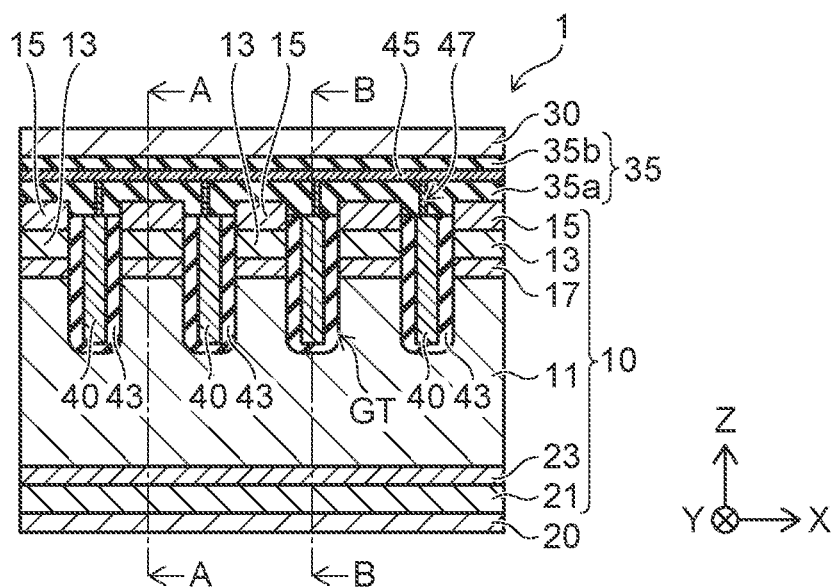
FIGS. 2A to 2C are schematic cross-sectional views illustrating the semiconductor device according to the first embodiment.
Figure 2B:
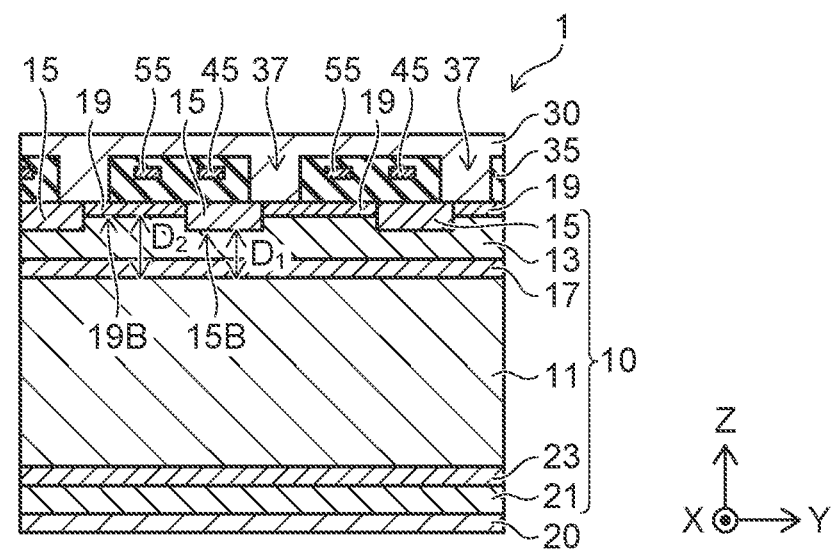
Figure 2C:
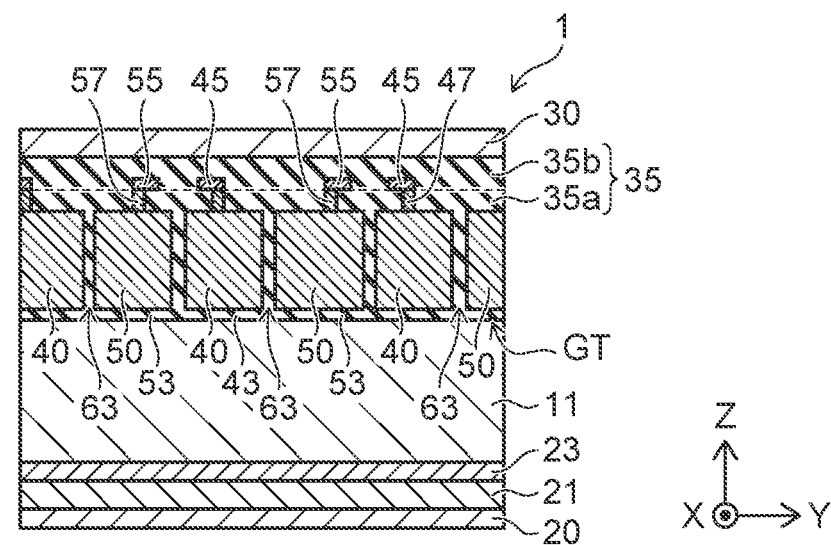

FIGS. 2A to 2C are schematic cross-sectional views illustrating the semiconductor device 1 according to the first embodiment. FIG. 2B is a cross-sectional view along line A-A shown in FIG. 2A. FIG. 2C is a cross-sectional view along line B-B shown in FIG. 2A. The semiconductor device 1 is, for example, an IGBT (Insulated Gate Bipolar Transistor).

The semiconductor device 1 includes a semiconductor part 10, a first electrode (hereinbelow, a collector electrode 20), a second electrode (hereinbelow, an emitter electrode 30), and a first control electrode (hereinbelow, a gate electrode 40).

The semiconductor part 10 is, for example, silicon. The collector electrode 20 and the emitter electrode 30 are, for example, metal layers including at least one selected from the group consisting of aluminum (Al), titanium (Ti), nickel (Ni), tungsten (W), gold (Au), polysilicon, etc. The gate electrode 40 is, for example, conductive polysilicon.

The semiconductor part 10 is provided between the collector electrode 20 and the emitter electrode 30. The collector electrode 20 is provided on the back surface of the semiconductor part 10. The emitter electrode 30 is provided at the front side of the semiconductor part 10.

The gate electrode 40 is disposed inside a gate trench GT provided in the semiconductor part 10. For example, multiple gate trenches GT are arranged in a direction along the front surface of the semiconductor part 10. The gate electrodes 40 are disposed inside the multiple gate trenches GT, respectively. For example, the gate trenches GT have depths of 1 to 10 µm. The spacing of the adjacent gate trenches GT is, for example, 0.1 to several µm.

For example, the gate electrode 40 is electrically insulated from the semiconductor part 10 by a first insulating portion (hereinbelow, a gate insulating film 43). The gate insulating film 43 is, for example, a silicon oxide film. Also, the gate electrode 40 is electrically insulated from the emitter electrode 30 by an inter-layer insulating film 35.

The gate electrode 40 is electrically connected to a first interconnect (hereinbelow, a gate interconnect 45). For example, the gate interconnect 45 is provided inside the inter-layer insulating film 35. The gate interconnect 45 is positioned between the semiconductor part 10 and the emitter electrode 30. For example, the gate interconnect 45 is connected to a gate terminal G1 (referring to FIG. 1).

For example, the inter-layer insulating film 35 includes an insulating film 35a and an insulating film 35b. The gate interconnect 45 is provided between the insulating film 35a and the insulating film 35b. The insulating film 35a and the insulating film 35b are, for example, silicon oxide films.

The gate interconnect 45 includes connection portions 47 extending through the insulating film 35a and reaching the gate electrodes 40. The gate interconnect 45 extends in a direction (e.g., the X-direction) along the front surface of the semiconductor part 10. The gate interconnect 45 is electrically connected to the multiple gate electrodes 40 via the connection portions 47.

The semiconductor part 10 includes a first layer of a first conductivity type (hereinbelow, an n-type base layer 11), a second layer of a second conductivity type (hereinbelow, a p-type base layer 13), a third layer of the first conductivity type (hereinbelow, an n-type emitter layer 15), and an n-type barrier layer 17.

The n-type base layer 11 extends between the collector electrode 20 and the emitter electrode 30. The gate trench GT is provided to extend into the n-type base layer 11 from the front surface of the semiconductor part 10. For example, the n-type base layer 11 includes an n-type impurity with a concentration of $1 \times 10^{12}$ to $1 \times 10^{15}$ cm$^{-3}$. The thickness in the Z-direction of the n-type base layer 11 is, for example, 1 to 1000 µm. For example, the n-type impurity concentration and the thickness in the Z-direction of the n-type base layer 11 are set to achieve the desired breakdown voltage.

The p-type base layer 13 is provided between the n-type base layer 11 and the emitter electrode 30. The p-type base layer 13 faces the gate electrode 40 via the gate insulating film 43. For example, the p-type base layer 13 includes a p-type impurity with a surface density of $1 \times 10^{12}$ to $1 \times 10^{14}$ cm$^{-2}$, and the thickness in the Z-direction of the p-type base layer 13 is, for example, about 0.1 to several µm.

Figure 3A:
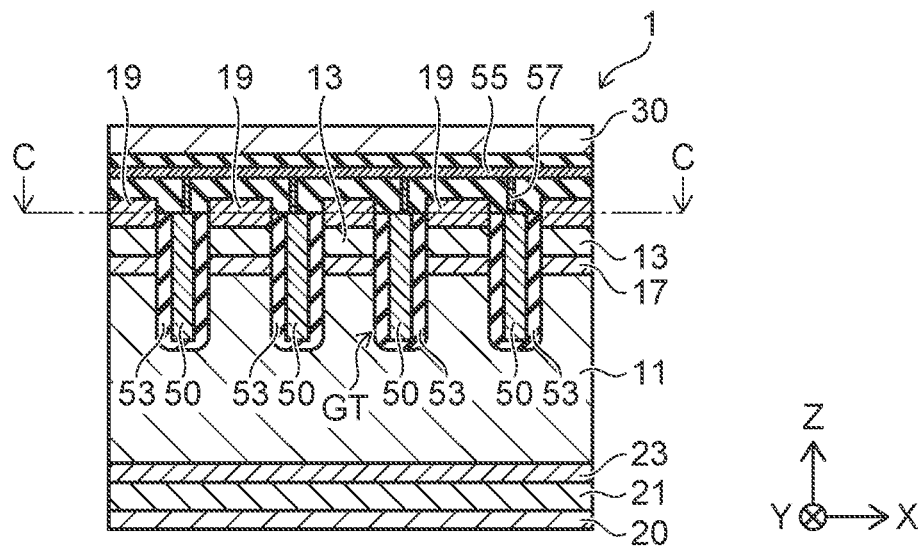
FIGS. 3A and 3B are other schematic cross-sectional views illustrating the semiconductor device according to the first embodiment.
Figure 3B:
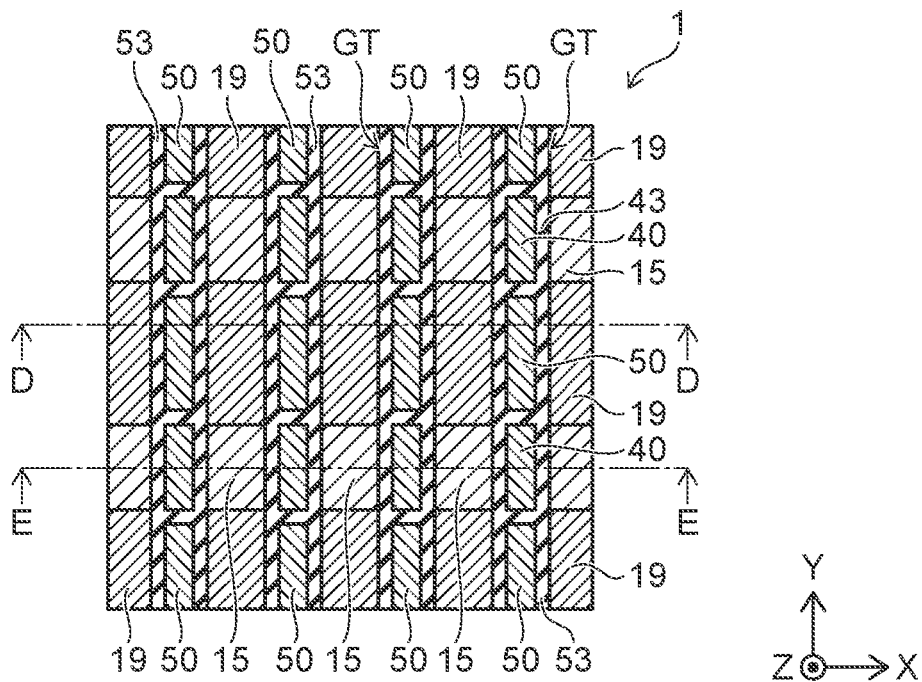

The n-type emitter layer 15 is selectively provided between the p-type base layer 13 and the emitter electrode 30 (referring to FIG. 3B). The n-type emitter layer 15 is provided at a position where the n-type emitter layer 15 contacts the gate insulating film 43. The n-type emitter layer 15 includes an n-type impurity with a higher concentration than the concentration of the n-type impurity in the n-type base layer 11. For example, the n-type emitter layer 15 includes an n-type impurity with a surface density of $1 \times 10^{14}$ to $1 \times 10^{16}$ cm$^{-2}$. The thickness in the Z-direction of the n-type emitter layer 15 is, for example, about 0.1 to several µm.

The n-type barrier layer 17 is provided between the n-type base layer 11 and the p-type base layer 13. The n-type barrier layer 17 includes an n-type impurity with a higher concentration than the concentration of the n-type impurity in the n-type base layer 11. The n-type barrier layer 17 includes, for example, an n-type impurity with a surface density of $1 \times 10^{12}$ to $1 \times 10^{14}$ cm$^{-2}$. The thickness in the Z-direction of the n-type barrier layer 17 is, for example, 0.1 to several µm. The embodiment also includes structures in which the n-type barrier layer 17 is not provided.

As shown in FIG. 2B, the semiconductor part 10 further includes a fourth layer of the second conductivity type (hereinbelow, a p-type contact layer 19), a fifth layer of the second conductivity type (hereinbelow, a p-type collector layer 21), and an n-type buffer layer 23.

The p-type contact layer 19 is selectively provided between the p-type base layer 13 and the emitter electrode 30 (referring to FIG. 3B). The p-type contact layer 19 includes a p-type impurity with a higher concentration than the p-type impurity concentration of the p-type base layer 13. For example, the p-type contact layer 19 includes a p-type impurity with a surface density of $1 \times 10^{14}$ to $1 \times 10^{16}$ cm$^{-2}$. The thickness in the Z-direction of the p-type contact layer 19 is, for example, about 0.1 to several µm.

The p-type collector layer 21 is provided between the n-type base layer 11 and the collector electrode 20. The p-type collector layer 21 is electrically connected to the collector electrode 20. For example, the p-type collector layer 21 includes a p-type impurity with a surface density of $1 \times 10^{13}$ to $1 \times 10^{15}$ cm$^{-2}$, and the thickness in the Z-direction of the p-type collector layer 21 is, for example, about 0.1 to 10 µm. For example, the p-type collector layer 21 has a p-type impurity concentration higher than the p-type impurity concentration of the p-type base layer 13. There also may be cases where the p-type impurity concentration of the p-type base layer 13 is lower than that of the p-type collector layer 21, when the p-type impurity concentration of the p-type collector layer 21 is set to be high level.

The n-type buffer layer 23 is provided between the n-type base layer 11 and the p-type collector layer 21. The n-type buffer layer 23 includes an n-type impurity with a higher concentration than the concentration of the n-type impurity in the n-type base layer 11.

As shown in FIG. 2B, the emitter electrode 30 includes a connection portion 37 extending through the inter-layer insulating film 35 and contacting the n-type emitter layer 15 and the p-type contact layer 19. The n-type emitter layer 15 and the p-type contact layer 19 are electrically connected to the emitter electrode 30 via the connection portion 37. The p-type base layer 13 is electrically connected to the emitter electrode 30 via the p-type contact layer 19 and the connection portion 37.

In the example, the n-type emitter layer 15 has a lower surface 15B in the depth direction from the front surface of the semiconductor part 10. The p-type contact layer 19 has a lower surface 19B in the depth direction from the front surface of the semiconductor part 10. The lower surface 15B is provided at a position deeper than the lower surface 19B. In other words, a spacing $D_1$ between the n-type emitter layer 15 and the n-type base layer 11 is less than a spacing $D_2$ between the p-type contact layer 19 and the n-type base layer 11. Here, the direction from the emitter electrode 30 toward the collector electrode 20 is taken as the depth direction; for example, "deeper" describes a longer distance from the front surface of the semiconductor part 10. This is similar hereinbelow.

Moreover, the p-type base layer 13 includes a portion between the n-type base layer 11 and the n-type emitter layer 15, and other portion between the n-type base layer 11 and the p-type contact layer 19. The thickness in the Z-direction of the portion between the n-type base layer 11 and the n-type emitter layer 15 is less than the thickness in the Z-direction of the other portion between the n-type base layer 11 and the p-type contact layer 19.

As shown in FIG. 2C, the semiconductor device 1 further includes a second control electrode (hereinbelow, a gate electrode 50). The gate electrode 50 is disposed inside the gate trench GT with the gate electrode 40. The gate electrode 40 and the gate electrode 50 are arranged in a direction (e.g., the Y-direction) along the front surface of the semiconductor part 10.

For example, the gate electrode 50 is electrically insulated from the semiconductor part by a second insulating portion (hereinbelow, a gate insulating film 53). Also, the gate electrode 50 is electrically insulated from the gate electrode 40 by an insulating film 63.

The gate electrode 50 is electrically insulated from the emitter electrode 30 by the inter-layer insulating film 35. The gate electrode 50 is electrically connected to a second interconnect (hereinbelow, a gate interconnect 55). For example, the gate interconnect 55 is provided inside the inter-layer insulating film 35. The gate interconnect 55 is positioned between the semiconductor part 10 and the emitter electrode 30. The gate interconnect 55 is provided apart from the gate interconnect 45 and electrically isolated from the gate interconnect 45. The gate interconnect 55 includes a connection portion 57 extending through the insulating film 35a and reaching the gate electrode 50. For example, the gate interconnect 55 is connected to a gate terminal G2 (referring to FIG. 1).

FIGS. 3A and 3B are other schematic cross-sectional views illustrating the semiconductor device 1 according to the first embodiment. FIG. 3A is a cross-sectional view along line D-D shown in FIG. 3B. FIG. 3B is a cross-sectional view along line C-C shown in FIG. 3A. FIG. 2A is a cross-sectional view along line E-E shown in FIG. 3B.

As shown in FIG. 3A, the gate electrode 50 is electrically insulated from the semiconductor part 10 by the gate insulating film 53. The p-type base layer 13 faces the gate electrode 50 via the gate insulating film 53.

The gate interconnect 55 extends between the semiconductor part 10 and the emitter electrode 30 in a direction (e.g., the X-direction) along the front surface of the semiconductor part 10. The gate interconnect 55 is electrically connected to the multiple gate electrodes 50 via the connection portions 47.

As shown in FIG. 3B, for example, the gate trenches GT extend in the Y-direction. The gate electrodes 40 and 50 are arranged alternately in the extension direction of the gate trenches GT. For example, the n-type emitter layer 15 and the p-type contact layer 19 are arranged alternately in the extension direction of the gate trenches GT between two adjacent gate trenches GT.

In the example, the n-type emitter layer 15 faces the gate electrode 40 via the gate insulating film 43. The p-type contact layer 19 faces the gate electrode 50 via the gate insulating film 53.

Figure 4A:
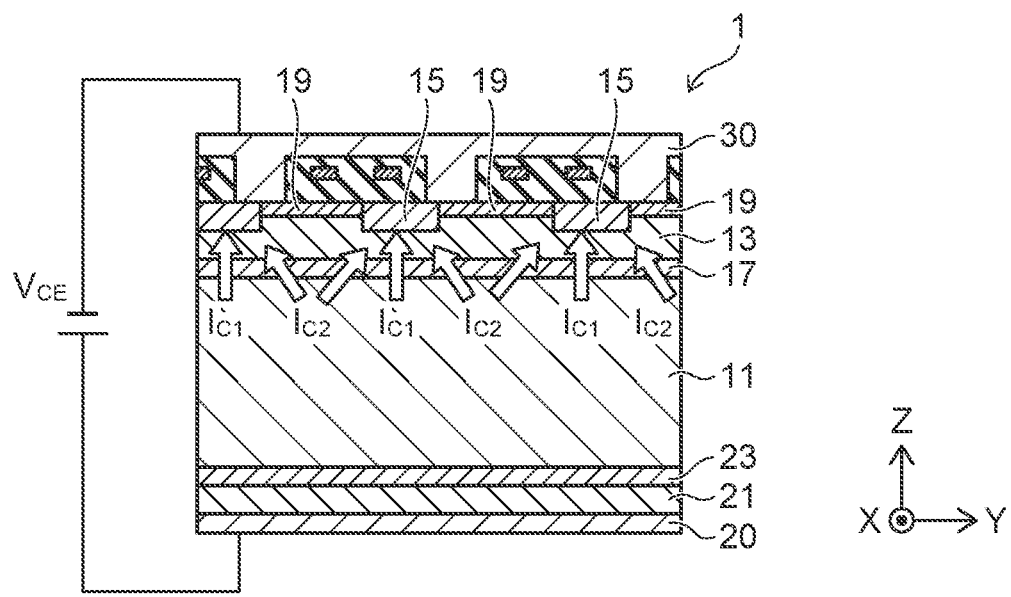
FIGS. 4A and 4B are schematic views showing characteristics of the semiconductor device according to the first embodiment.
Figure 4B:
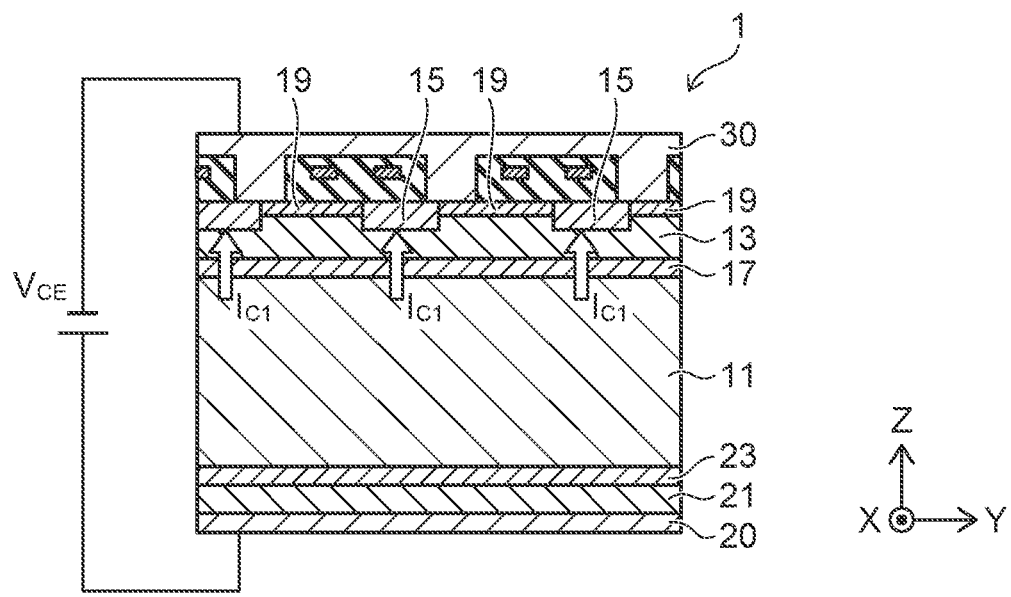

FIGS. 4A and 4B are schematic views showing characteristics of the semiconductor device according to the first embodiment. FIGS. 4A and 4B show the cross section shown in FIG. 2B. In the example, a voltage $V_{CE}$ is applied between the collector electrode 20 and the emitter electrode 30. When the potential of the collector electrode 20 is greater than the potential of the emitter electrode 30, collector currents $I_{C1}$ and $I_{C2}$ flow from the collector electrode 20 to the emitter electrode 30 due to the controls of the gate electrode 40 and the gate electrode 50.

In the example shown in FIG. 4A, ON-voltages that are greater than the respective threshold voltages of the gate electrodes 40 and 50 are applied between the emitter electrode 30 and the gate electrode 40 and between the emitter electrode 30 and the gate electrode 50. Thereby, n-type inversion layers are induced between the p-type base layer 13 and the gate insulating film 43 (referring to FIG. 2A) and between the p-type base layer 13 and the gate insulating film 53 (referring to FIG. 3A). Thereby, the collector currents $I_{C1}$ and $I_{C2}$ flow from the n-type base layer 11 to the n-type emitter layer 15 via the n-type barrier layer 17 and the n-type inversion layers.

The collector current $I_{C1}$ flows through the n-type inversion layer induced at the interface between the p-type base layer 13 and the gate insulating film 43. On the other hand, the collector current $I_{C2}$ flows through the n-type inversion layer induced at the interface between the p-type base layer 13 and the gate insulating film 53.

In the semiconductor device 1, the n-type emitter layer 15 protrudes toward the n-type base layer 11 from the level of the lower surface of the p-type contact layer 19. Therefore, the collector current $I_{C2}$ flows easily; and the value of the collector current $I_{C2}$ increases.

In the example shown in FIG. 4B, the ON-voltage that is greater than the threshold voltage of the gate electrode 40 is applied between the emitter electrode 30 and the gate electrode 40. On the other hand, an OFF-voltage that is less than the threshold voltage of the gate electrode 50 is applied between the emitter electrode 30 and the gate electrode 50. Therefore, the n-type inversion layer is not induced at the interface between the p-type base layer 13 and the gate insulating film 53, and the collector current $I_{C2}$ does not flow.

Thus, in the semiconductor device 1, the channel resistance to a collector current $I_{CE}$ can be changed by controlling the gate voltages applied to the gate electrodes 40 and 50. Also, the change of the channel resistance due to the ON/OFF of the gate electrode 50 can be increased by providing the n-type emitter layer 15 to protrude from the level of the lower surface of the p-type contact layer 19 toward the n-type base layer 11.

Figure 5A:
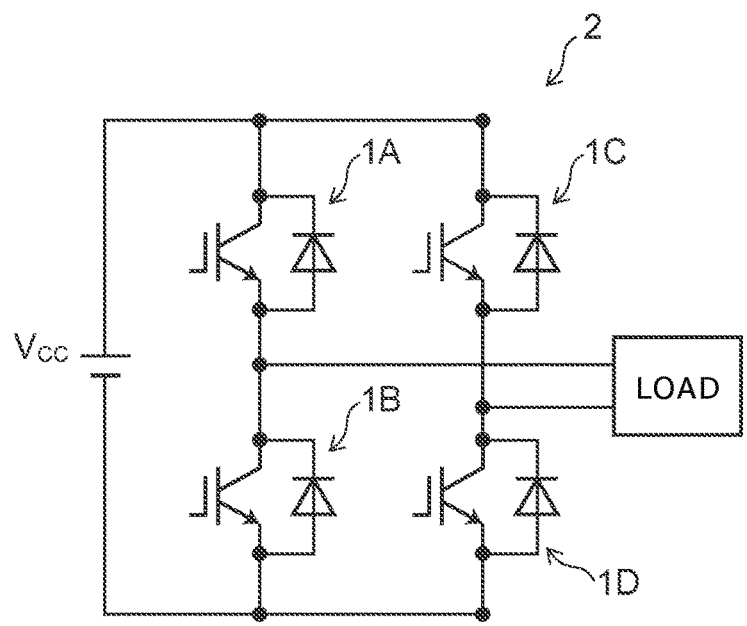
FIGS. 5A and 5B are schematic views showing characteristics of a power conversion circuit using the semiconductor device according to the first embodiment.
Figure 5B:
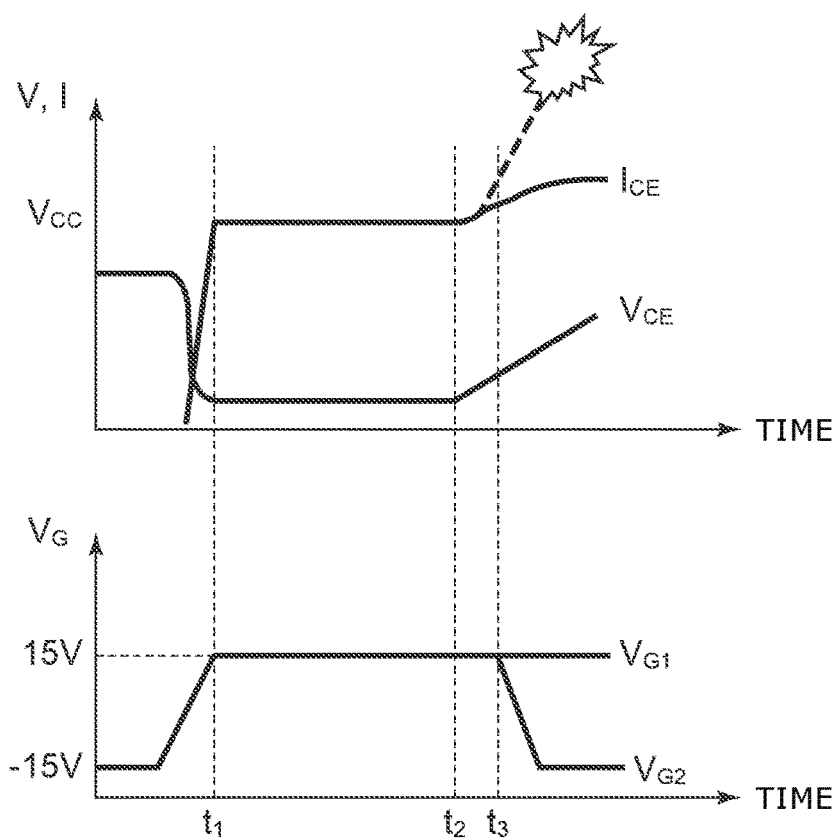

FIGS. 5A and 5B are schematic views showing characteristics of a power conversion circuit 2 using the semiconductor device 1 according to the first embodiment. FIG. 5A is a circuit diagram showing the power conversion circuit 2.

FIG. 5B is a time chart illustrating a method for controlling the power conversion circuit 2.

The power conversion circuit 2 shown in FIG. 5A is, for example, an inverter circuit using four semiconductor devices 1A to 1D. In the power conversion circuit 2, for example, the semiconductor device 1A and the semiconductor device 1B that are connected in series between power supply lines are controlled to repeat ON and OFF alternately.

For example, FIG. 5B shows the temporal change of the collector-emitter voltage $V_{CE}$, the collector current $I_{CE}$, and gate voltages $V_{G1}$ and $V_{G2}$ of the semiconductor device 1A.

For example, the semiconductor device 1A is in the OFF-state until a time $t_1$, and is set to the ON-state at the time $t_1$. On the other hand, the semiconductor device 1B is in the ON-state until directly before the time $t_1$, and is set to the OFF-state at the time $t_1$.

For example, a gate voltage $V_G$ of positive 15 V is applied to the gate electrodes 40 and 50 of the semiconductor device 1B directly before the time $t_1$. Accordingly, the collector-emitter voltage $V_{CE}$ decreases; for example, the electrical conduction is provided at the time $t_1$ between the collector and the emitter. The collector current $I_{CE}$ gradually increases to the ON-level at the time $t_1$.

For example, when the semiconductor device 1B is shorted at a time $t_2$, the power supply lines above and below are in a short-circuit state, and the collector current $I_{CE}$ that flows in the semiconductor device 1A starts to increase. Accordingly, the collector-emitter voltage $V_{CE}$ also starts to rise.

In the power conversion circuit 2, for example, when the rise of the collector-emitter voltage $V_{CE}$ is detected at a time $t_3$ directly after the time $t_2$, the gate voltage $V_{G2}$ that is applied to the gate electrode 50 is lowered to negative 15 V. Thereby, the n-type inversion layer induced between the p-type base layer 13 and the gate insulating film 53 disappears (referring to FIGS. 4A and 4B); the collector-emitter channel width becomes narrow; the resistance increases: and pinch-off occurs easily. Therefore, the increase of the collector current $I_{CE}$ is suppressed.

For example, as shown by the broken line in FIG. 5B, if the collector current $I_{CE}$ continues to increase, the temperature of the semiconductor part 10 increases, making the collector current $I_{CE}$ increase acceleratingly; and so-called thermal runaway occurs. As a result, there may be cases where the semiconductor device 1A is broken.

In the embodiment, by appropriately controlling the gate electrode 50 to prevent such thermal runaway, the semiconductor device 1A can be prevented from being broken. In other words, in the semiconductor device 1, breakdown immunity to a short circuit current can be improved.

FIGS. 6A to 6E are schematic cross-sectional views illustrating the semiconductor device 1 according to a first modification of the first embodiment. FIGS. 6A to 6E are partial cross-sectional views corresponding to the cross section shown in FIG. 3B.

Figure 6A:
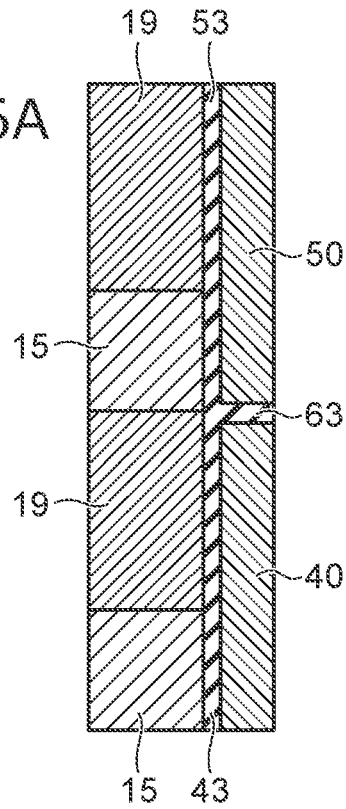
FIGS. 6A to 6E are schematic cross-sectional views illustrating the semiconductor device according to a first modification of the first embodiment.

In the example shown in FIG. 6A, the n-type emitter layer 15 and the p-type contact layer 19 face the gate electrode 40 via the gate insulating film 43. Also, another n-type emitter layer 15 and another p-type contact layer 19 face the gate electrode 50 via the gate insulating film 53.

Figure 6B:
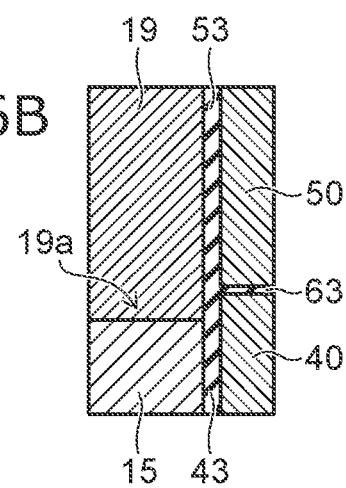

In the example shown in FIG. 6B, the n-type emitter layer 15 faces the gate electrode 40 via the gate insulating film 43. The p-type contact layer 19 faces the gate electrode 50 via the gate insulating film 53. The p-type contact layer 19 further includes a portion 19a facing the gate electrode 40 via the gate insulating film 43.

Figure 6C:
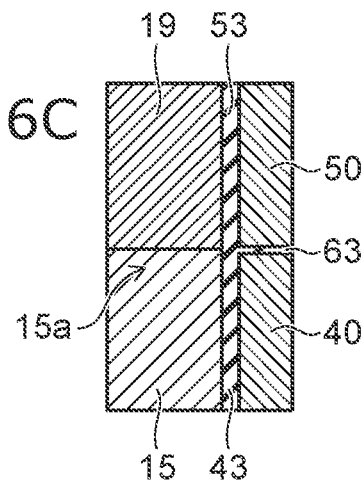

In the example shown in FIG. 6C, the n-type emitter layer 15 faces the gate electrode 40 via the gate insulating film 43. The n-type emitter layer 15 further includes a portion 15a facing the gate electrode 50 via the gate insulating film 53. The p-type contact layer 19 faces the gate electrode 50 via the gate insulating film 53.

Figure 6D:
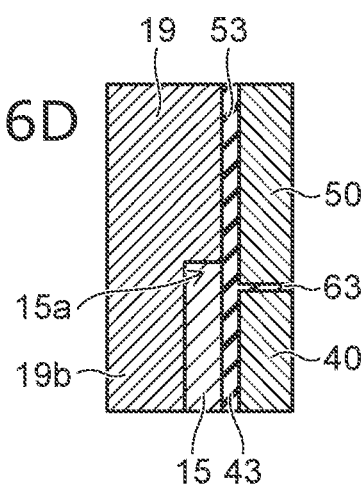

In the example shown in FIG. 6D, the n-type emitter layer 15 faces the gate electrode 40 via the gate insulating film 43. The n-type emitter layer 15 further includes the portion 15a facing the gate electrode 50 via the gate insulating film 53. The p-type contact layer 19 faces the gate electrode 50 via the gate insulating film 53. Also, the p-type contact layer 19 includes, for example, a portion 19b extending between the adjacent gate electrodes 40. The n-type emitter layer 15 is provided between the gate electrode 40 and the portion 19b of the p-type contact layer 19.

Figure 6E:
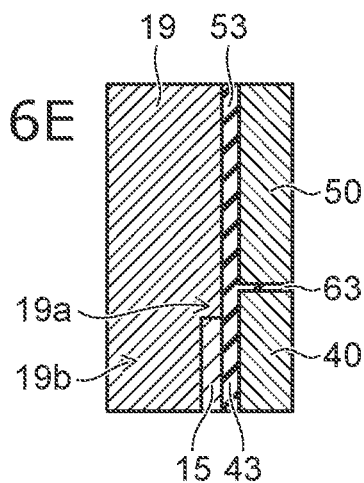

In the example shown in FIG. 6E, the n-type emitter layer 15 faces the gate electrode 40 via the gate insulating film 43. The p-type contact layer 19 faces the gate electrode 50 via the gate insulating film 53. The p-type contact layer 19 further includes the portion 19a facing the gate electrode 40 via the gate insulating film 43. Also, for example, the p-type contact layer 19 includes the portion 19b extending between the adjacent gate electrodes 40, and the n-type emitter layer 15 is provided between the gate electrode 40 and the portion 19b of the p-type contact layer 19.

FIGS. 7A to 7E are schematic cross-sectional views illustrating the semiconductor device 1 according to a second modification of the first embodiment. FIGS. 7A to 7E are partial cross-sectional views corresponding to the cross section shown in FIG. 3B. In the example shown in FIGS. 7A to 7E, the p-type base layer 13 is provided in addition to the n-type emitter layer 15 and the p-type contact layer 19.

Figure 7A:
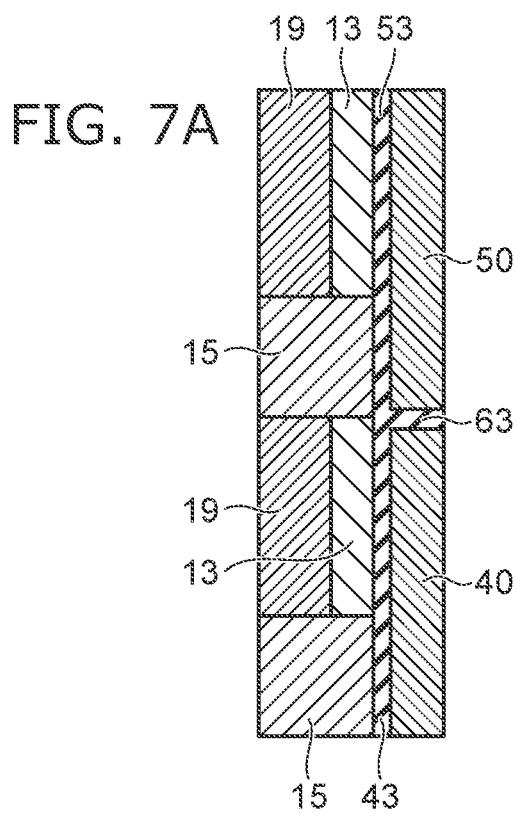
FIGS. 7A to 7E are schematic cross-sectional views illustrating the semiconductor device according to a second modification of the first embodiment.

In the example shown in FIG. 7A, the p-type base layer 13 and the n-type emitter layer 15 face the gate electrode 40 via the gate insulating film 43. Also, the p-type base layer 13 and another n-type emitter layer 15 face the gate electrode 50 via the gate insulating film 53.

The p-type base layer 13 includes a portion provided between the p-type contact layer 19 and the gate insulating film 43. Also, the p-type base layer 13 includes another portion provided between another p-type contact layer 19 and the gate insulating film 53.

Figure 7B:
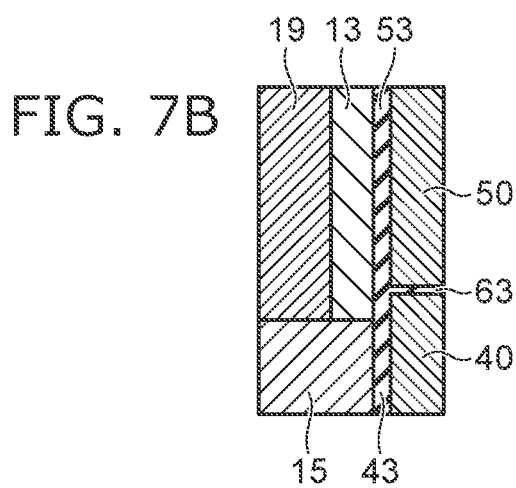

In the example shown in FIG. 7B, the n-type emitter layer 15 faces the gate electrode 40 via the gate insulating film 43. The p-type base layer 13 faces the gate electrode 50 via the gate insulating film 53. The p-type base layer 13 is provided between the p-type contact layer 19 and the gate electrode 50.

Figure 7C:
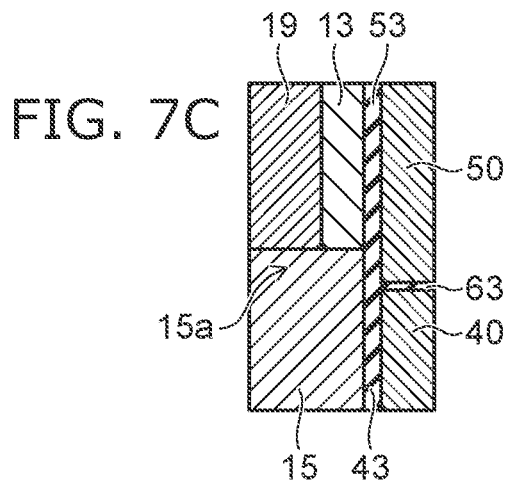

In the example shown in FIG. 7C, the n-type emitter layer 15 faces the gate electrode 40 via the gate insulating film 43. The n-type emitter layer 15 further includes the portion 15a facing the gate electrode 50 via the gate insulating film 53. The p-type base layer 13 faces the gate electrode 50 via the gate insulating film 53. The p-type base layer 13 is provided between the p-type contact layer 19 and the gate electrode 50.

Figure 7D:
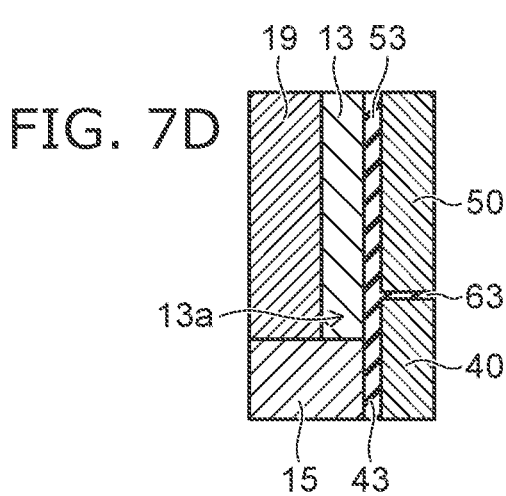

In the example shown in FIG. 7D, the n-type emitter layer 15 faces the gate electrode 40 via the gate insulating film 43. The p-type base layer 13 faces the gate electrode 50 via the gate insulating film 53. The p-type base layer 13 further includes a portion 13a facing the gate electrode 40 via the gate insulating film 43. The p-type base layer 13 is provided between the p-type contact layer 19 and the gate electrode 50. The portion 13a of the p-type base layer 13 is provided between the p-type contact layer 19 and the gate electrode 40.

Figure 7E:
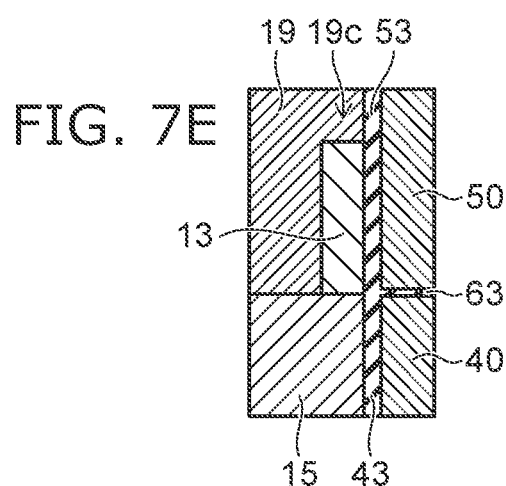

In the example shown in FIG. 7E, the n-type emitter layer 15 faces the gate electrode 40 via the gate insulating film 43. The p-type base layer 13 faces the gate electrode 50 via the gate insulating film 53. The p-type base layer 13 is provided between the p-type contact layer 19 and the gate electrode 50. The p-type contact layer 19 includes a portion 19c that contacts the gate insulating film 53 and faces the gate electrode 50.

FIGS. 8A to 8D are schematic cross-sectional views illustrating the semiconductor device 1 according to a third modification of the first embodiment. FIGS. 8A to 8D are partial cross-sectional views corresponding to the cross section shown in FIG. 3B. Also, in the example shown in FIGS. 8A to 8D, the p-type base layer 13 is provided in addition to the n-type emitter layer 15 and the p-type contact layer 19.

Figure 8A:
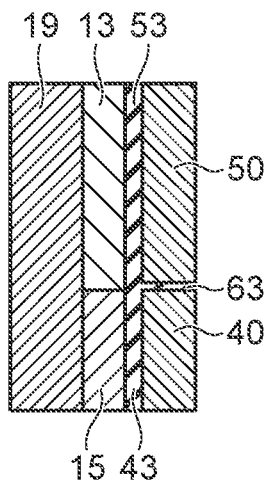
FIGS. 8A to 8D are schematic cross-sectional views illustrating the semiconductor device according to a third modification of the first embodiment.

In the example shown in FIG. 8A, the n-type emitter layer 15 faces the gate electrode 40 via the gate insulating film 43. The p-type base layer 13 faces the gate electrode 50 via the gate insulating film 53. The n-type emitter layer 15 is provided between the p-type contact layer 19 and the gate electrode 40. The p-type base layer 13 is provided between the p-type contact layer 19 and the gate electrode 50.

Figure 8C:
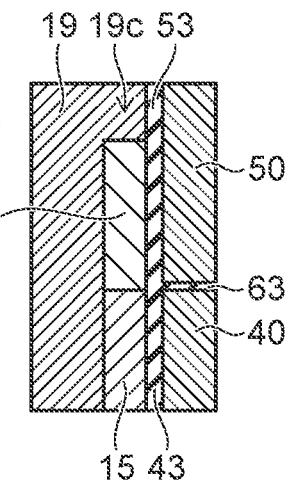
Figure 8B:
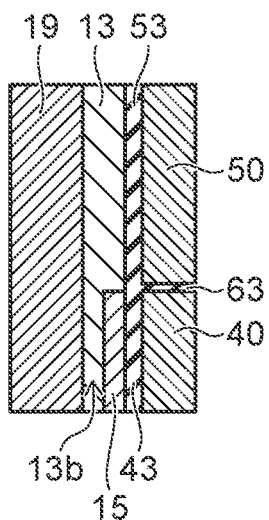

In the example shown in FIG. 8B, the n-type emitter layer 15 faces the gate electrode 40 via the gate insulating film 43. The p-type base layer 13 faces the gate electrode 50 via the gate insulating film 53. The n-type emitter layer 15 is provided between the p-type contact layer 19 and the gate electrode 40. The p-type base layer 13 is provided between the p-type contact layer 19 and the gate electrode 50. The p-type base layer 13 further includes a portion 13b extending between the n-type emitter layer 15 and the p-type contact layer 19.

In the example shown in FIG. 8C, the n-type emitter layer 15 faces the gate electrode 40 via the gate insulating film 43. The p-type base layer 13 faces the gate electrode 50 via the gate insulating film 53. The n-type emitter layer 15 is provided between the p-type contact layer 19 and the gate electrode 40. The p-type base layer 13 is provided between the p-type contact layer 19 and the gate electrode 50. The p-type contact layer 19 includes the portion 19c that contacts the gate insulating film 53 and faces the gate electrode 50.

Figure 8D:
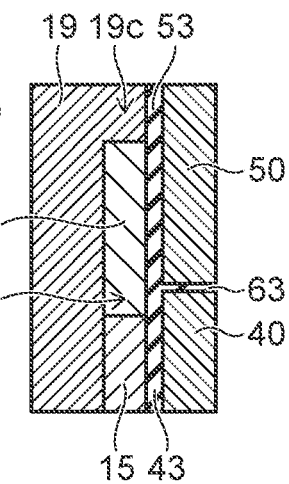

In the example shown in FIG. 8D, the n-type emitter layer 15 faces the gate electrode 40 via the gate insulating film 43. The p-type base layer 13 faces the gate electrode 50 via the gate insulating film 53. The p-type base layer 13 further includes the portion 13a facing the gate electrode 40 via the gate insulating film 43. The n-type emitter layer 15 is provided between the p-type contact layer 19 and the gate electrode 40. The p-type base layer 13 is provided between the p-type contact layer 19 and the gate electrode 50. The portion 13a of the p-type base layer 13 is provided between the p-type contact layer 19 and the gate electrode 40. The p-type contact layer 19 includes the portion 19c that contacts the gate insulating film 53 and faces the gate electrode 50.

Second Embodiment

Figure 9A:
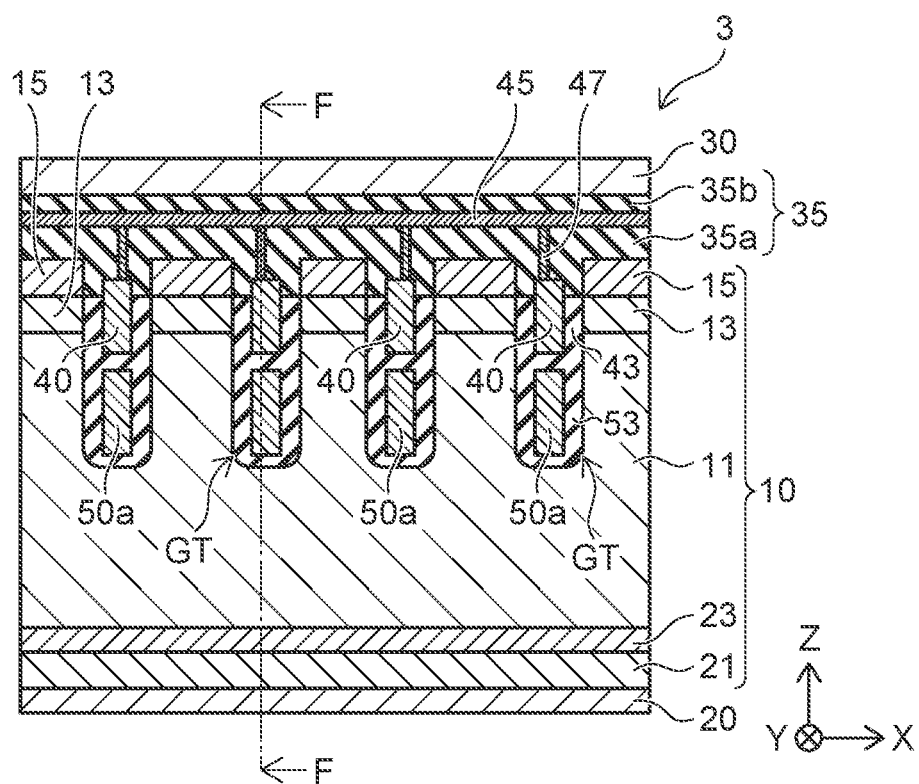
FIGS. 9A and 9B are schematic cross-sectional views illustrating a semiconductor device according to a second embodiment.
Figure 9B:
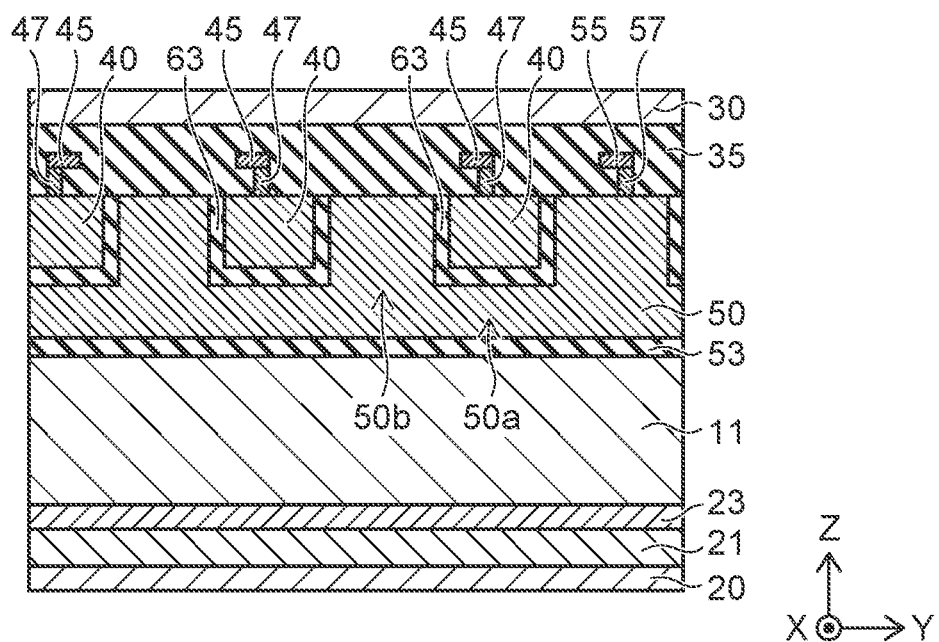

FIGS. 9A and 9B are schematic cross-sectional views illustrating a semiconductor device 3 according to a second embodiment. FIG. 9A is a cross-sectional view corresponding to the cross section shown in FIG. 2A. FIG. 9B is a cross-sectional view along line F-F shown in FIG. 9A.

In the example as shown in FIG. 9A, the gate electrode 50 includes a first portion 50a positioned between the collector electrode 20 and the gate electrode 40. The first portion 50a is provided at a deeper level than the p-type base layer 13. The first portion 50a is provided inside the n-type base layer 11 and faces the n-type base layer 11 via the gate insulating film 53.

The gate electrode 40 faces the p-type base layer 13 via the gate insulating film 43. The gate electrode 40 has the lower end positioned at a deeper level than the lower surface of the p-type base layer 13.

As shown in FIG. 9B, multiple gate electrodes 40 are provided inside one gate trench GT. The multiple gate electrodes 40 are arranged in the extending direction of the gate trench GT (e.g., the Y-direction). The gate electrodes 40 are electrically insulated from the gate electrode 50 by the insulating films 63.

The gate electrode 50 includes the first portion 50a and second portions 50b. The second portion 50b is provided between two gate electrodes 40 of the multiple gate electrodes 40. The two gate electrodes are adjacent to each other in the Y-direction. For example, the p-type base layer 13 extends continuously in the Y-direction and faces the second portions 50b of the gate electrode 50 via the gate insulating film 53. The first portion 50a of the gate electrode 50 extends continuously in the Y-direction and electrically connects the multiple second portions 50b. Thereby, for example, the number of the gate interconnects 55 can be reduced, and the emitter electrode 30 can be easily connected to the n-type emitter layer 15 and the p-type contact layer 19.

Also, in the example, while the semiconductor device 3 is in the ON-state, the OFF-voltage, e.g., negative 15 V is applied between the emitter electrode 30 and the gate electrode 50. Thereby, the n-type inversion layer that is induced at the interface between the p-type base layer 13 and the gate insulating film 53 disappears, and the collector current $I_{C2}$ does not flow (referring to FIGS. 4A and 4B).

Also, a p-type inversion layer is induced at the interface between the n-type base layer 11 and the gate insulating film 53. Therefore, the current path between the adjacent first portions 50a of the gate electrode 50 becomes narrow, and the ON-resistance increases. Therefore, the collector current $I_{C1}$ shown in FIG. 4B can be suppressed further. In other words, the increase of the short circuit current can be suppressed further by inducing the p-type inversion layer at the interface between the n-type base layer 11 and the gate insulating film 53.

In the embodiment, the lower end of the n-type emitter layer 15 may be positioned at the same level as the lower end of the p-type contact layer 19 or at a shallower level than the lower end of the p-type contact layer 19.

Figure 10:
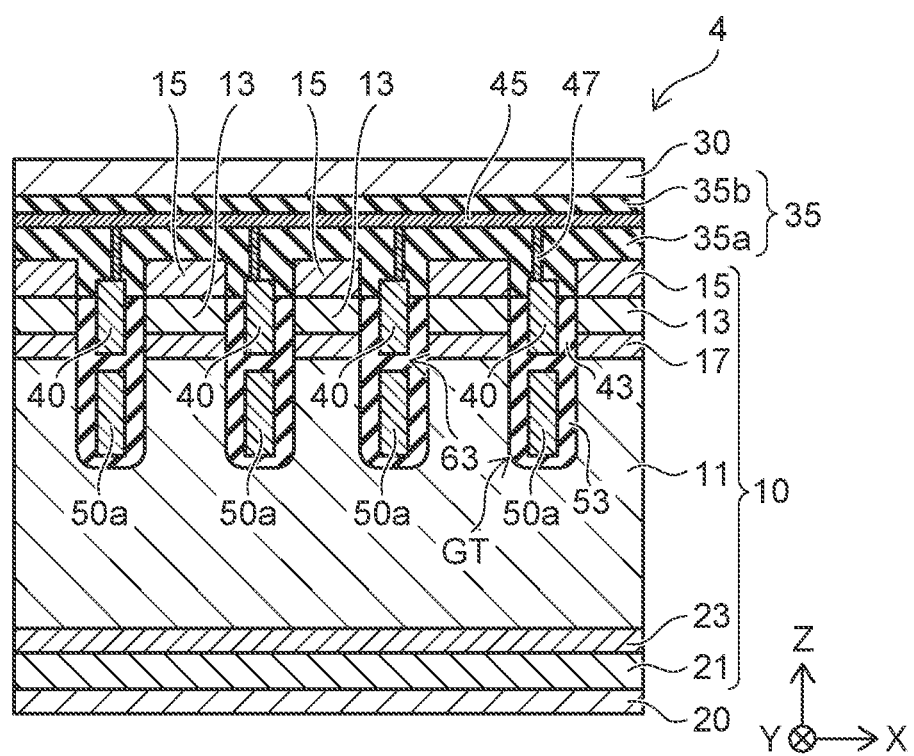
FIG. 10 is a schematic cross-sectional view illustrating a semiconductor device according to a modification of the second embodiment.

FIG. 10 is a schematic cross-sectional view illustrating a semiconductor device 4 according to a modification of the second embodiment.

The semiconductor part 10 shown in FIG. 10 further includes the n-type barrier layer 17 provided between the n-type base layer 11 and the p-type base layer 13. The gate electrode 40 and the second portion 50b of the gate electrode face at least portions of the n-type barrier layer 17 respectively via the gate insulating film 43 and the gate insulating film 53.

The n-type barrier layer 17 increases the potential barrier to the holes moving from the n-type base layer 11 to the p-type base layer 13 and suppresses the ejection of the holes from the n-type base layer 11 to the p-type base layer 13. Thereby, the carrier density inside the n-type base layer 11 is increased, and the ON-resistance is reduced. In the semiconductor device 1 shown in FIG. 1, the n-type barrier layer 17 also provides similar effects.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor part having a trench at a front side;
a first electrode provided on a back surface of the semiconductor part;
a second electrode provided at the front side of the semiconductor part;
a plurality of first control electrodes provided inside the trench of the semiconductor part between the second electrode and the semiconductor part, each of the first control electrodes being electrically insulated from the semiconductor part by a first insulating portion; and
a plurality of second control electrodes provided inside the trench with the first control electrodes, the first control electrodes and the second control electrodes being arranged alternately along an inner wall of the trench in the semiconductor part, the first and second control electrodes being arranged in a first direction along a front surface of the semiconductor part, each of the second control electrodes being electrically insulated from the semiconductor part by a second insulating portion, the second control electrodes being electrically insulated from the first control electrodes, respectively, by a third insulating portion,
the semiconductor part including a first layer of a first conductivity type, a second layer of a second conductivity type, a third layer of the first conductivity type, a fourth layer of the second conductivity type, and a fifth layer of the second conductivity type,
the first layer extending between the first electrode and the second electrode, the trench extending into the first layer from the front surface of the semiconductor part,
the second layer being provided between the first layer and the second electrode, the second layer facing each of the first control electrodes via the first insulating portion, the second layer facing each of the second control electrodes via the second insulating portion,
the third layer being selectively provided between the second layer and the second electrode, the third layer being provided apart from the first layer with a first portion of the second layer interposed, the third layer contacting the first insulating portion, the third layer being electrically connected to the second electrode,
the fourth layer being selectively provided between the second layer and the second electrode, the fourth layer being provided apart from the first layer with a second portion of the second layer interposed, the fourth layer including a second conductivity type impurity with a higher concentration than a concentration of a second conductivity type impurity in the second layer, the fourth layer being electrically connected to the second electrode,
the fifth layer being provided between the first layer and the first electrode, the fifth layer being electrically connected to the first electrode,
the first portion of the second layer having a first thickness in a second direction from the first electrode toward the second electrode,
the second portion of the second layer having a second thickness in the second direction, the first thickness being less than the second thickness.

2. The device according to claim 1, further comprising:
an inter-layer insulating film electrically insulating the first control electrodes and the second control electrodes from the second electrode;
a first interconnect provided inside the inter-layer insulating film and electrically connected to the first control electrodes; and
a second interconnect provided inside the inter-layer insulating film and electrically connected to the second control electrodes,
the second electrode including a connection portion extending through the inter-layer insulating film, the connection portion contacting the third layer and the fourth layer of the semiconductor part.

3. The device according to claim 1, wherein
the third layer of the semiconductor part includes a portion contacting the second insulating portion.

4. The device according to claim 1, wherein
a plurality of the third layers is provided in the semiconductor part, one of the third layers contacting the first insulating portion, other one of the third layers contacting the second insulating portion.

5. The device according to claim 1, wherein
the fourth layer of the semiconductor part contacts the second insulating portion.

6. The device according to claim 1, wherein
the second layer of the semiconductor part includes a third portion provided between the fourth layer of the semiconductor part and the first insulating portion.

7. The device according to claim 1, wherein
the second layer of the semiconductor part includes a fourth portion provided between the fourth layer of the semiconductor part and the second insulating portion.

8. The device according to claim 1, wherein
the semiconductor part further includes a sixth layer of the first conductivity type, the sixth layer being provided between the first layer and the fifth layer, the sixth layer including a first conductivity type impurity with a higher concentration than a concentration of a first conductivity type impurity in the first layer.

9. The device according to claim 1, wherein
the semiconductor part further includes a seventh layer of the first conductivity type, the seventh layer being provided between the first layer and the second layer, the seventh layer including a first conductivity type impurity with a higher concentration than a concentration of a first conductivity type impurity in the first layer.

10. A semiconductor device, comprising:
a semiconductor part having a trench at a front side;
a first electrode provided on a back surface of the semiconductor part;
a second electrode provided at the front side of the semiconductor part;
a first control electrode provided inside the trench of the semiconductor part between the second electrode and the semiconductor part, the first control electrode being electrically insulated from the semiconductor part by a first insulating portion; and
a second control electrode provided inside the trench of the semiconductor part with the first control electrode, the second control electrode including a first portion and a second portion, the first portion being provided between the first control electrode and the first electrode, the first portion extending in a direction along the front surface of the semiconductor part, the first control electrode and the second portion of the second control electrode being arranged in the first direction along an inner wall of the trench, the second control electrode being electrically insulated from the semiconductor part by a second insulating portion, the second control electrode being electrically insulated from the first control electrode by a third insulating portion, the semiconductor part including a first layer of a first conductivity type, a second layer of a second conductivity type, a third layer of the first conductivity type, a fourth layer of the second conductivity type, and a fifth layer of the second conductivity type, the first layer extending between the first electrode and the second electrode, the trench extending into the first layer from the front surface of the semiconductor part, the second layer being provided between the first layer and the second electrode, the second layer facing the first control electrode via the first insulating portion, the second layer facing the second control electrode via the second insulating portion, the third layer being selectively provided between the second layer and the second electrode, the third layer contacting the first insulating portion, the third layer being electrically connected to the second electrode, the fourth layer being selectively provided between the second layer and the second electrode, the fourth layer being electrically connected to the second electrode, the fifth layer being provided between the first layer and the first electrode, the fifth layer being electrically connected to the first electrode.

11. The device according to claim 10, wherein
the first portion of the second control electrode faces the first layer of the semiconductor part via the second insulating portion.

12. The device according to claim 10, wherein
a plurality of the first control electrodes is provided inside the trench of the semiconductor part,
the second control electrode includes a plurality of the second portions,
the first control electrodes and the second portions of the second control electrode are arranged alternately in the first direction along the inner wall of the trench, and
the first portion of the second control electrode electrically connects the second portions.

13. The device according to claim 11, wherein
the semiconductor part further includes a sixth layer of the first conductivity type, the sixth layer being provided between the first layer and the fifth layer, the sixth layer including a first conductivity type impurity with a higher concentration than a concentration of a first conductivity type impurity in the first layer, and
the first control electrodes and the second portions of the second control electrode face at least a portion of the sixth layer via the first insulating portion and the second insulating portion, respectively.

14. The device according to claim 10, wherein
the semiconductor part further includes a seventh layer of the first conductivity type, the seventh layer being provided between the first layer and the second layer, the seventh layer including a first conductivity type impurity with a higher concentration than a first conductivity type impurity of the first layer.

15. A semiconductor device, comprising:
a semiconductor part having a trench at a front side;
a first electrode provided on a back surface of the semiconductor part;
a second electrode provided at the front side of the semiconductor part;
a first control electrode provided inside the trench of the semiconductor part between the second electrode and the semiconductor part, the first control electrode being electrically insulated from the semiconductor part by a first insulating portion; and
a second control electrode provided inside the trench with the first control electrode, the second control electrode being provided next to the first control electrode in an opening of the trench, the second control electrode being electrically insulated from the semiconductor part by a second insulating portion, the second control electrode facing the first control electrode with a third insulating portion interposed, the semiconductor part including a first layer of a first conductivity type, a second layer of a second conductivity type, a third layer of the first conductivity type, a fourth layer of the second conductivity type, and a fifth layer of the second conductivity type, the first layer extending between the first electrode and the second electrode, the trench extending into the first layer from the front surface of the semiconductor part, the second layer being provided between the first layer and the second electrode, the second layer facing the first control electrode via the first insulating portion, the second layer facing the second control electrode via the second insulating portion, the third layer being selectively provided between the second layer and the second electrode, the third layer being provided apart from the first layer with a first portion of the second layer interposed, the third layer contacting the first insulating portion, the third layer being electrically connected to the second electrode, the third layer being provided on the first portion of the second layer with a first distance from the first layer to the third layer, the fourth layer being selectively provided between the second layer and the second electrode, the fourth layer being provided apart from the first layer with a second portion of the second layer interposed, the fourth layer including a second conductivity type impurity with a higher concentration than a concentration of a second conductivity type impurity in the second layer, the fourth layer being electrically connected to the second electrode, the fourth layer being provided on the second portion of the second layer with a second distance from the first layer to the fourth layer, the second distance being longer than the first distance, the fifth layer being provided between the first layer and the first electrode, the fifth layer being electrically connected to the first electrode.

* * * * *